(12) United States Patent
Lu et al.

(10) Patent No.: US 11,468,947 B2
(45) Date of Patent: Oct. 11, 2022

(54) TECHNIQUES FOR INITIALIZING RESISTIVE MEMORY DEVICES BY APPLYING VOLTAGES WITH DIFFERENT POLARITIES

(71) Applicant: Hefei Reliance Memory Limited, Hefei (CN)

(72) Inventors: Zhichao Lu, San Jose, CA (US); Brent Haukness, Monte Sereno, CA (US); Gary Bronner, Los Altos, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 17/128,707

(22) Filed: Dec. 21, 2020

(65) Prior Publication Data

US 2021/0110870 A1    Apr. 15, 2021

Related U.S. Application Data

(63) Continuation of application No. 16/334,737, filed as application No. PCT/US2017/047902 on Aug. 22, 2017, now Pat. No. 10,943,655.

(Continued)

(51) Int. Cl.
*G11C 29/12*    (2006.01)
*G11C 13/00*    (2006.01)

(52) U.S. Cl.
CPC ...... *G11C 13/0069* (2013.01); *G11C 13/0007* (2013.01); *G11C 13/0026* (2013.01);
(Continued)

(58) Field of Classification Search
CPC ............ G11C 13/0069; G11C 13/0007; G11C 13/0026; G11C 13/0028; G11C 13/0038;
(Continued)

(56) References Cited

U.S. PATENT DOCUMENTS 6,651,202 B1    11/2003   Phan
9,025,396 B1    5/2015    Koushan et al.
(Continued)

FOREIGN PATENT DOCUMENTS

WO   WO-2010109876 A1 *  9/2010  ......... G11C 13/0007
WO      2013/046217 A2   7/2013

OTHER PUBLICATIONS

Extended European Search Report dated Dec. 10, 2019, issued in related European Application No. 17853626.4 (15 pages).
(Continued)

*Primary Examiner* — Sultana Begum
(74) *Attorney, Agent, or Firm* — Sheppard Mullin Richter & Hampton LLP

(57) ABSTRACT

The embodiments herein describe technologies of initializing resistive memory devices (e.g., non-volatile and volatile memory devices). In one method, a first voltage is applied across a resistance change material of a memory cell to form an initial filament and multiple cycles are performed to condition the initial filament. Each of the multiple cycles includes: applying a second voltage with a first polarity across the resistance change material; and applying a third voltage with a second polarity across the resistance change material.

11 Claims, 8 Drawing Sheets

Related U.S. Application Data

(60) Provisional application No. 62/486,834, filed on Apr. 18, 2017, provisional application No. 62/397,628, filed on Sep. 21, 2016.

(52) U.S. Cl.
CPC ...... G11C 13/0028 (2013.01); G11C 13/0038 (2013.01); G11C 13/0064 (2013.01); G11C 29/12 (2013.01); *G11C 2013/0073* (2013.01); *G11C 2013/0083* (2013.01)

(58) Field of Classification Search
CPC . G11C 13/0064; G11C 13/0073; G11C 29/12; G11C 2013/0083
See application file for complete search history.

(56) References Cited

U.S. PATENT DOCUMENTS

| | | | |
|---|---|---|---|
| 9,054,307 B2 | 6/2015 | Wang et al. | |
| 9,105,838 B2 | 8/2015 | Haimoto et al. | |
| 9,362,497 B2 | 6/2016 | Kumar et al. | |
| 2006/0230375 A1* | 10/2006 | Casey | G06F 30/392 716/117 |
| 2008/0084751 A1 | 4/2008 | Li et al. | |
| 2011/0176351 A1 | 7/2011 | Fujitsuka et al. | |
| 2011/0216574 A1 | 9/2011 | Ichihara et al. | |
| 2011/0305066 A1 | 12/2011 | Nazarian et al. | |
| 2012/0230085 A1 | 9/2012 | Kawai et al. | |
| 2014/0003123 A1 | 1/2014 | Karpov et al. | |
| 2014/0126268 A1* | 5/2014 | Katayama | G11C 13/0069 365/148 |
| 2014/0241035 A1 | 8/2014 | Siau | |
| 2015/0287919 A1 | 10/2015 | Lin et al. | |
| 2016/0148681 A1 | 5/2016 | Bukethal | |
| 2019/0080754 A1* | 3/2019 | Tran | H01L 45/1273 |

OTHER PUBLICATIONS

Partial Supplementary European Search Report dated Jul. 25, 2019, issued in related European Application No. 17853626.4 (15 pages).
PCT International Search Report and the Written Opinion dated Nov. 2, 2017, issued in related International Application No. PCT/US2017/047902 (10 pages).
PCT International Preliminary Report on Patentability dated Apr. 4, 2019, issued in related International Application No. PCT/US2017/047902 (9 pages).
Non-Final Office Action dated Apr. 29, 2020, issued in related U.S. Appl. No. 16/334,737 (22 pages).
Search Report dated Oct. 30, 2020, issued in related Taiwanese Application No. 106123197 (1 page).
Office Action and Search Report dated Dec. 1, 2021, issued in related Taiwan Application No. 110122776, with English machine translation (14 pages).

* cited by examiner

TECHNIQUES FOR INITIALIZING RESISTIVE MEMORY DEVICES BY APPLYING VOLTAGES WITH DIFFERENT POLARITIES

CROSS REFERENCE TO RELATED APPLICATIONS

This application is a continuation application of U.S. patent application Ser. No. 16/334,737, filed on Mar. 19, 2019, which is a national stage application under 35 U.S.C. § 371 of PCT Application No. PCT/US2017/047902, filed on Aug. 22, 2017, which is based on and claims priority to U.S. Provisional Patent Application No. 62/397,628, filed on Sep. 21, 2016 and entitled "Parallel Forming Mode for Resistive Random Access Memory", and based on and claims priority to U.S. Provisional Patent Application No. 62/486,834, filed on Apr. 18, 2017, and entitled "Techniques for Initializing Resistive Memory Devices." The above-referenced applications are incorporated herein by reference in their entirety.

BACKGROUND

Non-volatile memory is a type of memory device that can store information even after loss of power. Non-volatile memory (NVM) devices can be read only memory or random access memory (RAM) and may use various technologies. One category of non-volatile RAM is resistive RAM, including technologies such as filamentary resistive random access memory (RRAM or ReRAM) cells, interfacial RRAM cells, magnetoresistive RAM (MRAM) cells, phase change memory (PCM) cells (e.g., chalcogenides including alloys of germanium, antimony, and tellurium), memristor memory elements, and programmable metallization cells (e.g., conductive bridging RAM (CBRAM) cell). The RRAM cell, including metal oxide, electrolyte devices for both bipolar and unipolar operations, is a promising non-volatile memory device for embedded and standalone applications due to its fast operation time and low power performance. RRAM cells, however, can demonstrate large resistance variation in memory array, such as from kilobits (Kbits) to gigabits (Gbits) (or even terabits (Tbits)). The resistance variation can lead to a wide resistance distribution for a low resistance state (LRS) and a high resistance state (HRS) of a RRAM cell. The resistance variation can also lead to a wide resistance distribution for intermediate states (IMS) used for multi-level cell states (MLC)). The wide resistance distribution can makes the memory array design and use difficult.

BRIEF DESCRIPTION OF THE DRAWINGS

The present disclosure is illustrated by way of example, and not by way of limitation, in the figures of the accompanying drawings.

DETAILED DESCRIPTION

The embodiments herein describe technologies of initializing a non-volatile memory cell with a FORM algorithm to strengthen filament characteristics of a filament of the non-volatile memory cell. As described above, RRAM cells demonstrate large resistance variation, resulting in a wide resistance distribution in LRS and HRS of the non-volatile memory cells of an array. The embodiments described herein can narrow the resistance distribution. In particular, the embodiments described herein control the tail bit distribution of the resistance distribution for HRS, LRS, IMS, or any combination thereof. Although various embodiments are described herein with respect to RRAM cells, other embodiments can be used with different filamentary RAM technologies, including, for example, CBRAM cells, programmable metallization cells, or the like. Similarly, the embodiments may be used in other resistive changing cells, including, for example, interfacial RRAM cells, MRAM cells, PCM cells, or other programmable metallization cells. Also, although various embodiments described herein are directed to RRAM cell in non-volatile memory devices, in other embodiments, the techniques described herein may be used for memory devices where data retention is not needed, such as in volatile memory devices.

Figure 1:
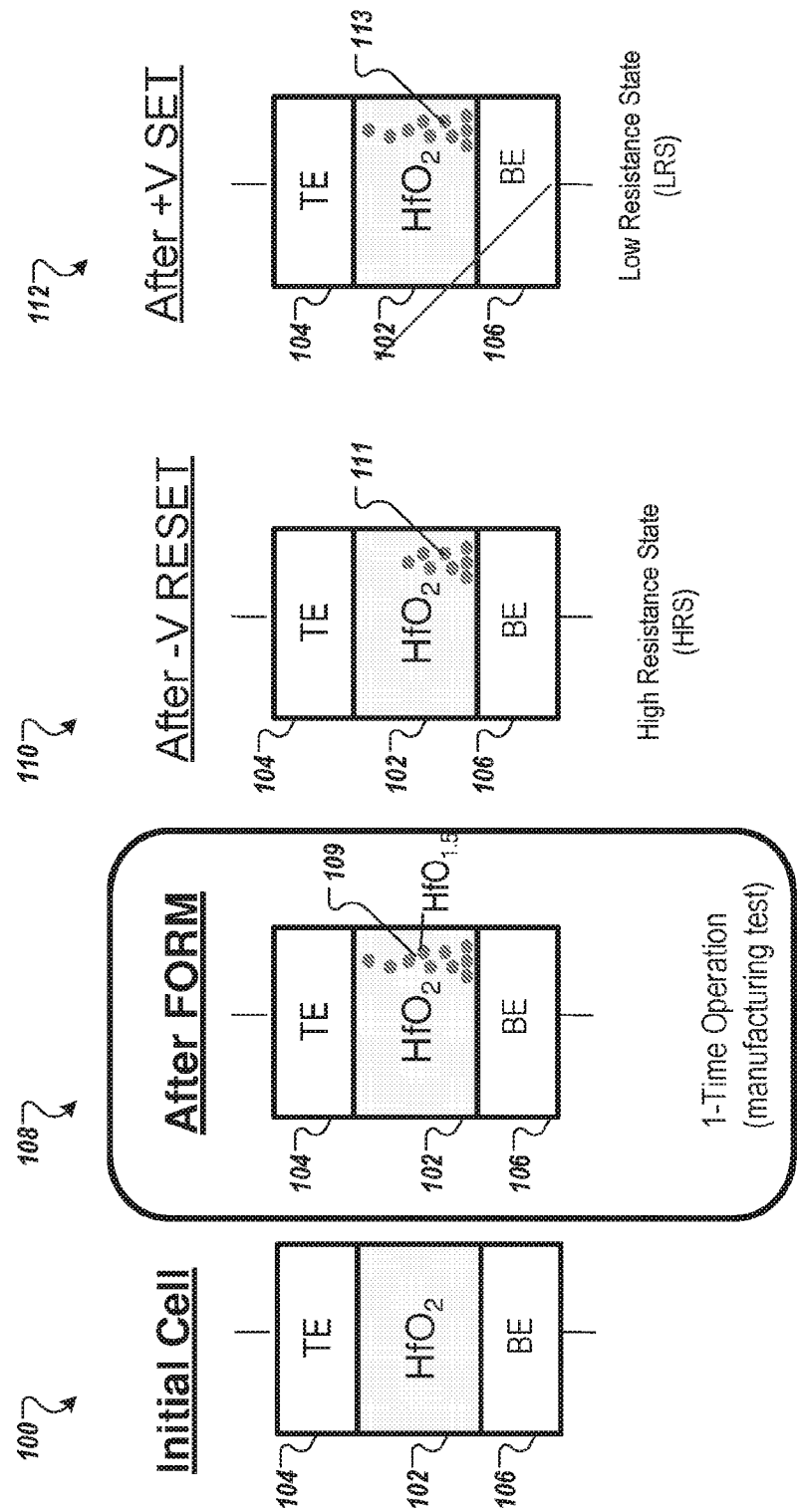
FIG. 1 is a block diagram illustrating a RRAM cell at different stages of manufacture and operation according to one embodiment.

FIG. 1 is a block diagram illustrating a RRAM cell at different stage of manufacture and operation according to one embodiment. The RRAM cell is a discrete, non-volatile, re-writable resistive memory cell made from any number of materials. In the depicted embodiment, the RRAM cell is manufactured as an initial cell 100, including resistance change material in an oxide layer 102 disposed between a top electrode 104 and a bottom electrode 106. The resistance change material can be dielectric material, as well as other materials that have different resistance states, such as various metal oxides like Hafnium oxide ($HfO_2$) or Titanium Oxide (TiOx). In one embodiment, the oxide layer 102 includes a single oxide. In another embodiment, the oxide layer 102 includes multiple oxides. Also, it should be noted that although a single oxide layer is shown in FIG. 1, in other embodiments, multi-oxide layers may be used. The top electrode 104 may include conductive material, e.g., metal, metal containing compositions, conductively-doped semiconductor materials, and the like. The bottom electrode 106 may also include conductive material. In the depicted embodiment, the bottom electrode 106 may include Titanium nitride (TiN). Alternatively, other conductive material or barrier metals may be used.

Once the initial cell 100 is manufactured, often during manufacturing test, a forming operation (also referred to herein as FORM operation) is performed on the initial cell 100, resulting in a cell 108 after the FORM operation. During the form operation, a voltage is applied across the resistance change material in the oxide layer 102 to form an initial filament 109. During a subsequent use of the cell 108 after FORM, another voltage can be applied across the oxide layer 102 in a reset operation (also referred to herein as RESET operation) to break the filament, as shown in the broken filament 111 of the cell 110 after RESET operation. The cell 110 after RESET operation is in a HRS. Also, during subsequent use of the cell 108 after FORM, another voltage can be applied across the oxide layer 102 in a set operation (also referred to herein as SET operation) to reform the filament, as shown in the reformed filament 113 of the cell 112 after SET operation. The cell 112 after SET operation is in a LRS. It should be noted that although the initial filament 109 illustrated in FIG. 1 is illustrated as a single filament at a certain filament gap location, in other embodiments, the filament gap can occur at any position of the switching layer and multiple filaments can be formed in the oxide layer 102.

The FORM operation can result in the oxide layer, which is normally an insulator, being made to conduct through a filament (or conduction path) formed after application of a voltage. Conventionally, a sufficiently high voltage was used to create the initial filament. As described herein, the FORM operations of the embodiments described herein, can utilize a lower voltage or a lower current than conventional FORM operations. It should be noted that the embodiments described herein are described with respect to voltages being applied across the oxide layer. In other embodiments, different FORM conditions may be used, such as voltage limits or current limits. The filament 109 can be created from vacancy or metal defect migration. In one embodiment in which the oxide layer 102 includes $HfO_2$, the FORM operation generates defects in the oxide layer 102, known as oxygen vacancies, which are bond locations where oxygen has been removed. The oxygen vacancies can charge and be driven under an electric field. Oxygen ions and oxygen vacancies operate in an analogous fashion to the concept of electrons and holes in other semiconductor technologies, although the physical mechanism of the movement of oxygen vacancies in dielectric films is different from that of electrons/holes in a semiconductor device. Once the filament 109 is formed, the filament can be reset (broken, resulting in high resistance) or set (re-formed, resulting in lower resistance). It should also be noted that multiple filaments (or conduction paths) may be created in the FORM and SET operations.

Conventionally, filamentary based RRAM cells, such as those based on HfO, require a forming operation to initially form the filament. This form operation is performed to enable use of the RRAM cell to store data. This forming operation needs only to be done once, and would typically be done at a manufacturing test. Conventionally, this forming operation is slow as compared to a normal write operation. For example, the conventional FORM operation can be hundreds of microseconds (μs) per address. Because the forming operation is slow compared to normal write operations, the test time involved is a concern to the viability of these RRAM technologies. Also, described herein are technologies of a parallel test mode that can significantly reduce overall form times, resulting in faster forming operations during the manufacturing test.

Also, the filament created using the conventional FORM operation is not uniform and may have undesirably large resistance variations. In particular, the resistance distribution is controlled by the operation method of the device. The voltage is applied to the RRAM cell to activate the memory device by creating the weak conductive filament in the media between top electrode and bottom electrode. The filament during forming is not uniform and may have undesirably large resistance variations. As described above, the resistance variation leads to wide resistance distribution for LRS and HRS, such as illustrated in FIG. 2.

Figure 2:
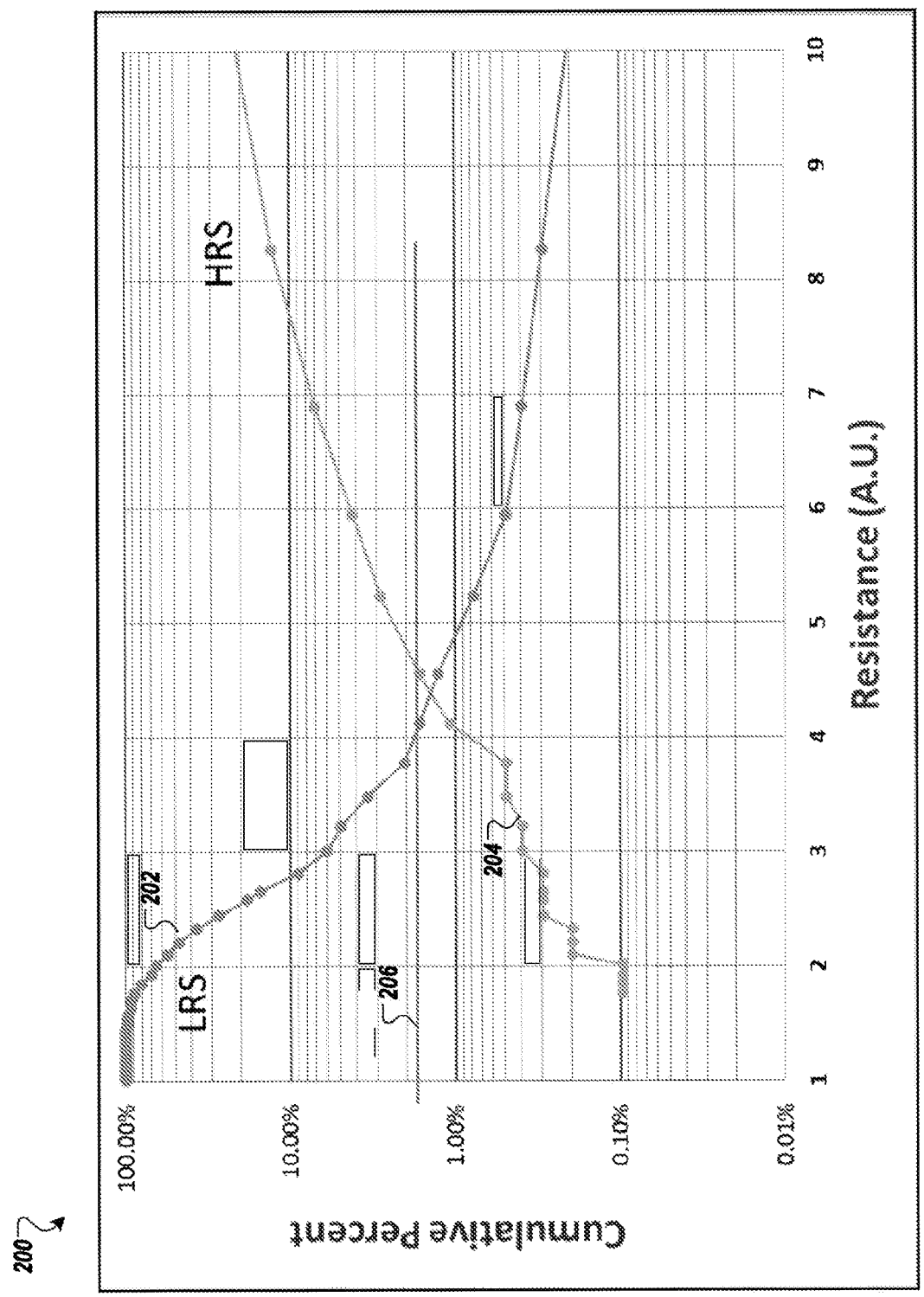
FIG. 2 is a graph showing a wide resistance distribution of a memory array with conventional filament characteristics according to one implementation.

FIG. 2 is a graph 200 showing a wide resistance distribution of a memory array with conventional filament characteristics according to one implementation. The graph 200 shows a cumulative percentage of the memory array with conventional filament characteristics with respect to resistance as an arbitrary unit (A.U.). Using the conventional FORM operation, all of the resulting cells of the array are set using a SET operation and the resulting cells are tested to determine their resistance. As shown, a cumulative percentage of 100% of the memory cells is measured in the LRS when the resistance is between 1 and 1.7 resistances (A.U). From there, the cumulative percentage tapers off in what is called a LRS tail bit distribution 202. Also, the cells of the array are reset using a RESET operation and the resulting cells are tested to determine their resistance. As shown, above 4.5 resistance (A.U), the cumulative percentage is measured in the HRS. In the HRS, the cumulative percentage also tapers off in what is called a HRS tail bit distribution 204. As shown in FIG. 2, the tail bit distributions of the HRS and LRS can be problematic and better resistance distributions are needed for RRAM to be manufactured for reliable use. The resistance variation can also affect the resistance distributions in IMS for multi-level cell states.

The embodiments described herein of the proposed FORM algorithms provide control of the tail bit distributions of the resistance distribution for HRS, LRS, IMS, or any combination thereof. The proposed FORM algorithms can be used to control the resistance distribution. In some embodiments, a voltage is applied to the RRAM cell to activate the memory device by creating a weak conductive filament in the media (e.g., oxide layer) between a top electrode and a bottom electrode. Initially, the filament during forming may not be uniform and may have large resistance variations. Then a sequence of the several operations (e.g., SET operations) to enhance the conductive filament and rupture (e.g., RESET operations) the filament follow the initial forming operation to shape and strengthen the filament, leading to a tighter resistance distribution for HRS, LRS and IMS. The sequence could be several SET operations followed by several RESET operations. SET and RESET could operate with uniform or non-uniform frequency. The number of the SET and RESET operations can vary from 1 time to any number of times (e.g., 1000 times or even more). After the memory device goes through this sequence, the memory device can normally operate similarly to a conventional RRAM cell, but with better tail bit distribution in the memory array for improved bit yield or improved device characteristics such as retention time or endurance.

FIGS. 3 and 6-8 illustrate multiple embodiments of a FORM operation, including a current-limited FORM operation (also referred to as a partial-FORM operation) and multiple filament-strengthening cycles to strengthen filament characteristics of the initial filament to obtain a filament with stronger filament characteristics than the initial filament. The filament-strengthening cycles can also be referred to as filament-conditioning or filament-shaping cycles.

Figure 3:
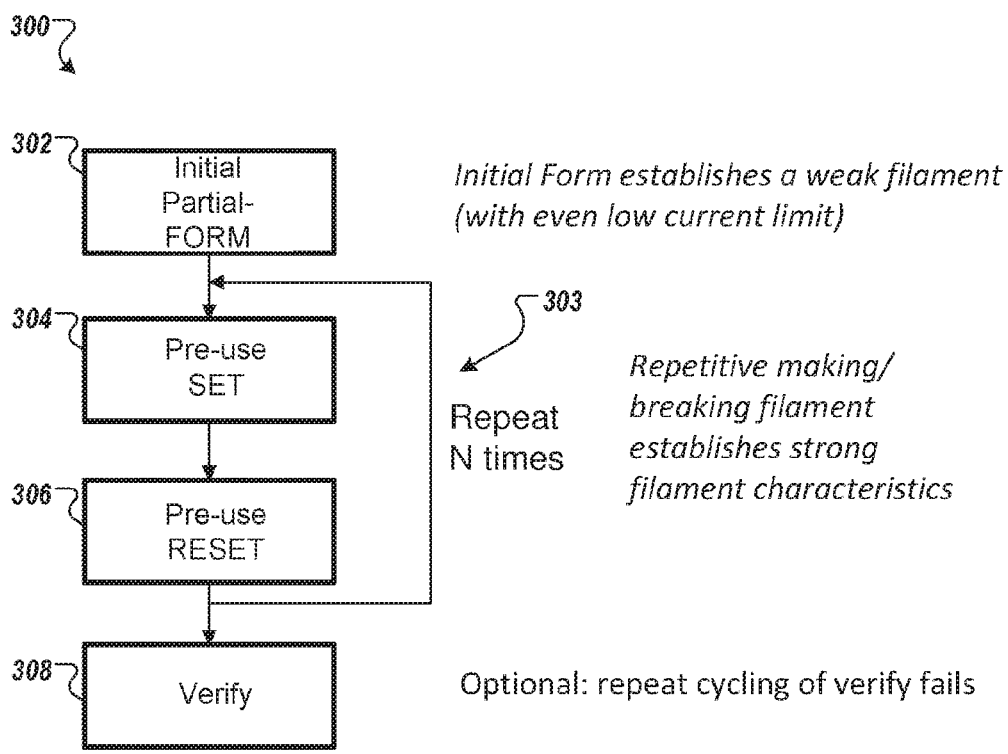
FIG. 3 is a method of initializing a non-volatile memory device using a current-limited FORM operation and multiple filament-strengthening cycles according to one embodiment.

FIG. 3 is a method 300 of initializing a non-volatile memory device using a current-limited FORM operation 302 (initial partial-FORM operation) and multiple filament-strengthening cycles 303 according to one embodiment. The method 300 begins with the current-limited FORM operation 302. The current-limited partial-FORM operation 302 can include applying a first voltage across the resistance change material of a non-volatile memory cell to form an initial filament with a first limit current (e.g., less than 50 microamps µA), such as the initial filament 109 illustrated in FIG. 1. The method 300 also includes multiple filament-strengthening cycles 303. Each of the filament-strengthening cycles 303 includes a first operation 304 to apply a second voltage with a first polarity across the resistance change material and a second operation 306 to apply a third voltage with a second polarity, which is different than the first polarity, across the dielectric resistance change material. In another embodiment, the second voltage and the third voltage also have different magnitudes. When the first voltage is applied to the resistance change material in the initial current-limited FORM operation 302, a first current through the resistance change material is limited to a value less than a second current limit (e.g., greater than 50 µA) through the resistance change material when the second voltage is applied to the resistance change material. In the depicted embodiment, the first operation 304 is performed before the second operation 306. In other embodiments, the order may be changed such that the second operation 306 is performed before the first operation 304. In some embodiments, a sequence of multiple first operations 304 can be performed, followed by a sequence of multiple second operations 306, or vice versa. In some cases of the FORM operation of method 300, the first and second operations 304, 306 of the filament-strengthening cycle 303 are pre-use SET and pre-use RESET operations, respectively. The pre-use SET operation can be similar to a SET operation used during actual use of the memory cell, such as illustrated in the cell 112 after the RESET operation. For example, the pre-use SET operation can use similar or smaller currents than the SET operation used during actual use. The pre-use RESET operation can be similar to a RESET operation used during actual use of the memory cell and can use similar or smaller currents than the RESET operation used during actual use, such as illustrated in the cell 110 after RESET operation. However, in other cases, the first and second operations 304, 306 of one of the filament-strengthening cycles 303 do not necessarily need to actually set or reset the filament. In other cases, conventional SET and RESET operations can be used for the first and second operations 304, 306. In other embodiments, the pre-use SET operation can use the exact same voltage (current or other characteristics) as the SET operation used during the actual use of the memory cell. In one embodiment, performance of the method 300 results in the cell 108 with the initial filament 109 illustrated in FIG. 1. Once the initial filament 109 is formed using the method 300, subsequent RESET and SET operations can be performed during use, resulting in the cell 110 after the RESET operation and resulting in the cell 112 after the SET operation, respectively, as illustrated in FIG. 1.

As further illustrated in FIG. 3, the method 300 includes a verify operation 308 to verify the cell resistances for the HRS and the LRS. If the verify operation fails, cycling can be repeated in one or more additional filament-strengthening cycles 303. Also, in some cases where SET, pre-use SET, RESET, and pre-use RESET operations are used, these operations can be verified by the verify operation 308. Alternatively, the verify operation 308 can be optional.

In some embodiments, the SET operation sets or makes the filament, whereas the RESET operation breaks or ruptures the filament. The embodiments described herein are not limited to multiple SET and RESET operations in the multiple filament-strengthening cycles 303, but can include the first and second operations 304, 306 that apply voltages with opposite polarities (opposite electric fields) to strengthen and weaken the filament created in the partial-FORM operation 302. More specifically, the first operation 304 increases, enhances, or otherwise strengthens conductivity of the initial filament created in the partial-FORM operation 302, regardless of whether the filament is considered to be set. Similarly, the second operation 306 decreases, diminishes, degrades, or otherwise weakens the conductivity of the initial filament created in the partial-FORM operation 302, regardless of whether the filament is considered to be reset (also referred to as broken). The repetitive cycling of the first and second operations (or specifically making and breaking the filament in some cases) establishes strong filament characteristics. The stronger filament characteristics improve resistance distribution, as illustrated and described below with respect to FIG. 4.

In some cases, the first and second operations 304, 306 are part of the manufacturing test. In such cases, the first operation 304 can be considered a pre-use SET operation, which may use similar currents or smaller currents as the SET operation used during use of the memory cell and the second operation 306 can be considered a pre-use RESET operation, which may use similar currents or smaller currents as the RESET operation used during use of the memory cell. In other cases, the first and second operations 304, 306 are part of a first use of the memory cell before the memory cells are available to store information during normal operation, for example, at a first boot of the memory array. In other embodiments, some or all of the proposed FORM operation, such as the method 300, can be performed by a BIST circuit.

Figure 4:
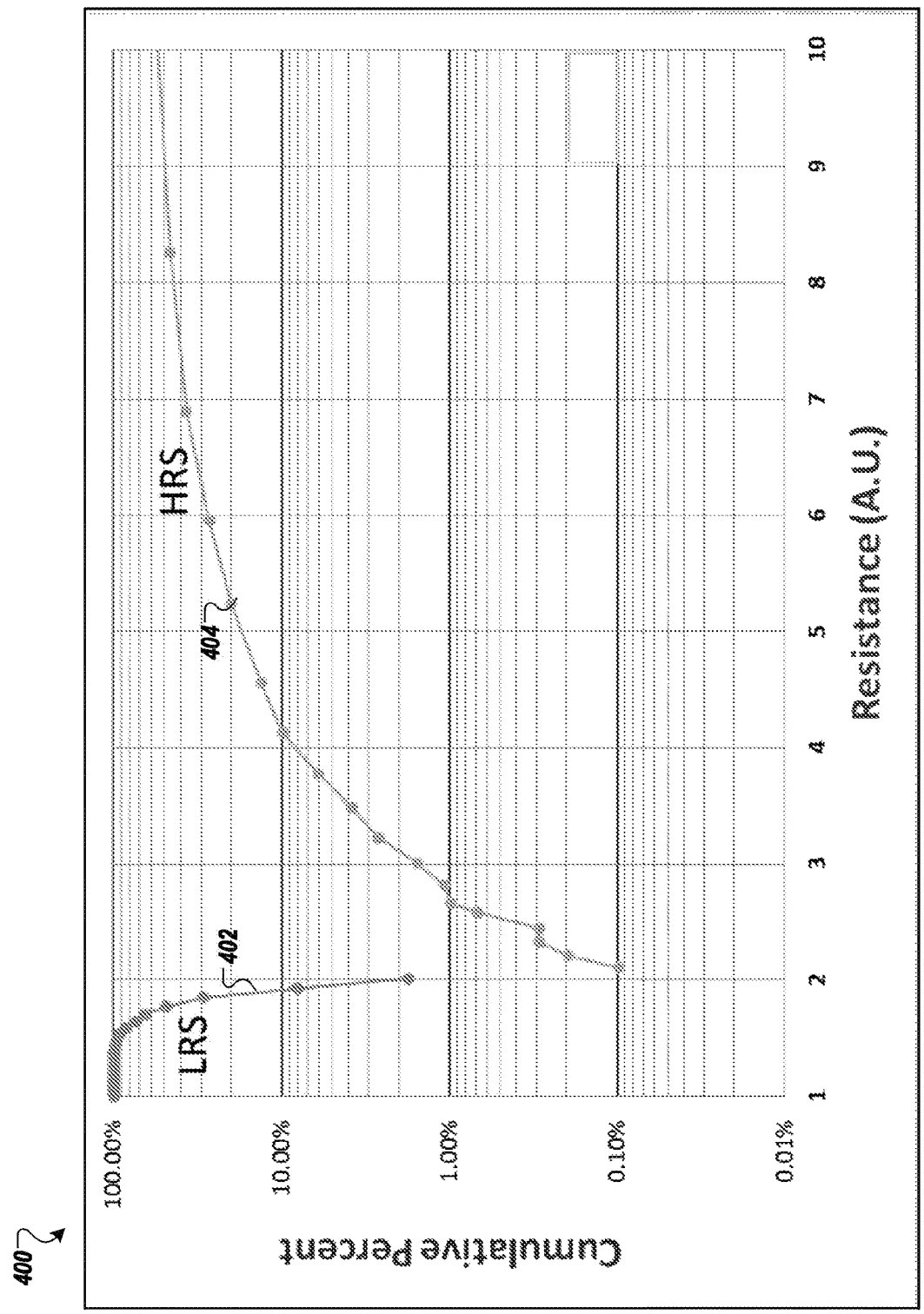
FIG. 4 is a graph showing a narrower resistance distribution of a memory array with stronger filament characteristics according to one embodiment.

For comparison, the resistance distribution of the conventional FORM operation is shown in FIG. 2 and the resistance distribution of the proposed FORM operation, described above with respect to method 300 of FIG. 3, is shown in FIG. 4. With the operation sequence in the proposed FORM operation, the tail bit of the memory array is well controlled as shown in FIG. 4. In particular, the graph 400 shows a cumulative percentage of the memory array with conventional filament characteristics with respect to resistance as an arbitrary unit (A.U.). Using the proposed FORM operation of method 300, all of the resulting cells of the array are set using a SET operation and the resulting cells are tested to determine their resistance. As shown, a cumulative percentage of 100% of the memory cells is measured in the LRS when the resistance is between 1 and 1.5 resistances (A.U). From there, the cumulative percentage tapers off in what is called a LRS tail bit distribution 402. The LRS tail bit distribution 402 is much tighter (or narrower) than the LRS tail distribution 202 of FIG. 2. Also, a HRS tail bit distribution 404 is tighter (or narrower) than the HRS tail distribution 204 of FIG. 2. As shown in FIG. 4, the tail bit distributions of the HRS and LRS can be tighter as a result of stronger filament characteristics from the proposed FORM operation in method 300. The strong filament characteristics results in less resistance variation, as shown in the graph 400 of FIG. 4.

It should be noted that the data shown in the graphs 200 and 400 are from a 1 transistor-1 resistor (1T1R) memory array structure. The proposed FORM operation can improve the tail bit distribution for the 1 selector-1 resistor (1S1R) and 1TnR/1SnR memory array. Similarly, the operations of the FORM operation, as described in the embodiments herein, can be applied to other filamentary resistive cells. It should also be noted that the proposed FORM operation can be controlled by a controller during a manufacturing test or controlled by a Built-In-Self-Test (BIST) circuit. The BIST circuit may be integrated into a same integrated circuit die as the memory cell(s). Alternatively, the BIST circuit can be integrated into a memory subsystem having multiple integrated circuits with memory cells. In some embodiments, a read operation can be used during cycling in the FORM operation. Alternatively, the read operation is not required during the cycling. Similarly, the cell resistances can be verified after a certain number of cycles or during each cycle. Verifying operations in each cycle may add to the test time, but verify operations after a certain number of cycles may verify the cell resistances with minimal additional test time. Alternatively, the verifying operations may not be required during the cycling of the FORM operation.

In another embodiment of a method for initializing a non-volatile memory device, a first voltage is applied across a resistance change material of a non-volatile memory cell to form an initial filament. Then, in a first cycle used to break and reform the initial filament, a second voltage with a first polarity is applied across the resistance change material and a third voltage with a second polarity is applied across the resistance change material. The second voltage can be greater in absolute magnitude than the first voltage. Similarly, the third voltage can be greater in absolute magnitude than the first voltage. In other embodiments, the second voltage could be smaller in absolute magnitude than the first voltage. Also, in other embodiments, during application of the second voltage, the current limit is changed (e.g., the current limit is higher than during application of the first voltage. After the first cycle, one or more additional cycles are used to break and reform the initial filament. The repetitive cycling strengthens the filament characteristics of the filament. In one embodiment, the second voltage is applied to put the resistance change material in a LRS and the third voltage is to put the resistance change material in HRS. In another embodiment, the second voltage is applied as part of a SET operation (or pre-use SET operation) to set the resistance change material in a LRS and the third voltage is applied as part of a RESET operation (or pre-use RESET operation) to reset the resistance change material in a HRS. In a further embodiment, the SET operation, RESET operation, or both can be verified. In a further embodiment, at least one additional cycle to break and reform the initial filament is performed when at least one of the SET operation or RESET operation fails.

As described herein, application of the first voltage and the multiple cycles in which the second and third voltages are applied can be part of a FORM operation during manufacturing test. The technique maybe used to shape the one or more filaments after certain functional cycles to achieve better distribution to extend the cell life. Alternatively, the FORM operation can be performed at or before a first actual use of the non-volatile memory cell. The application of the first voltage can also be considered part of a current-limited FORM operation, or initial partial-FORM operation. The current-limited FORM operation may result in a current through the resistance change material that is less than 50 micro amps (50 µA). Other operations of the repetitive cycles of the FORM operation can result in currents that are equal to the current-limited FORM operation up to typical currents used for SET and RESET operations of the memory cell, such as between 50 µA and 100 µA. Also, as described herein, the non-volatile memory cell is a RRAM cell and the resistance change material can be a dielectric material, such as Hafnium oxide ($HfO_2$). Alternatively, the non-volatile memory cell can be other filament-based resistive memory technologies (e.g., CBRAM, Programmable Metallization Cell, or the like) and the resistance change material can be other types of solid-state materials in which one or more filaments or other conductive paths may be formed.

In a further embodiment, the non-volatile memory device includes multiple bitlines and multiple wordlines. The non-volatile memory cell can be coupled to a bitline and a wordline. In one embodiment, the bit line can be activated with one or more additional bitlines during the proposed FORM operation. In another embodiment, during a normal array access, additional bitlines beyond what are activated for a normal read or write operation. Alternatively, the wordline can be activated with one or more additional wordlines during the proposed FORM operation. This is also referred to as parallel forming test mode. In another embodiment, the additional wordlines connect to cells on the same bitline. One embodiment of circuitry used for parallel forming test mode is described below with respect to FIG. 5.

In another embodiment of the method of initializing a filamentary RRAM cell, a first current is caused to flow through an oxide layer of the filamentary RRAM cell to create an initial filament having a first set of filament characteristics. A first electric field with a first polarity is applied across the oxide layer in a first cycle and a second electric field with a second polarity is applied across the oxide layer in the first cycle. After the first cycle, this process is repeated, applying the first electric field with the first polarity and the applying the second electric field with the second polarity in one or more additional cycles to form a filament of the filamentary RRAM cell having a second set of filament characteristics that is greater than the first set of filament characteristics. In other words, the first cycle and the one or more additional cycles strengthen the initial filament to have the second set of filament characteristics. The filament characteristics may include data retention characteristics, endurance characteristics, latency characteristics for subsequent SET and RESET operations, conducting gap distances, retention, retention after cycling, resistance distributions, including LRS tail bit distribution and HRS tail bit distribution, or the like. A first current that flows through the oxide layer when creating the initial filament is limited to a value less than a second current limit through the oxide layer when the first electric field is applied across the oxide layer.

In a further embodiment, the first current can be caused to flow through multiple filamentary RRAM cells of a RRAM device in parallel. The second set of characteristics of the filamentary RRAM cells reduces resistance variation in at least one of the HRS or the LRS. The reduced resistance variation results in better resistance distribution. In particular, the RRAM device may have better HRS tail bit distribution, better LRS tail bit distribution, better IMS tail bit distribution, or any combination thereof.

Figure 5:
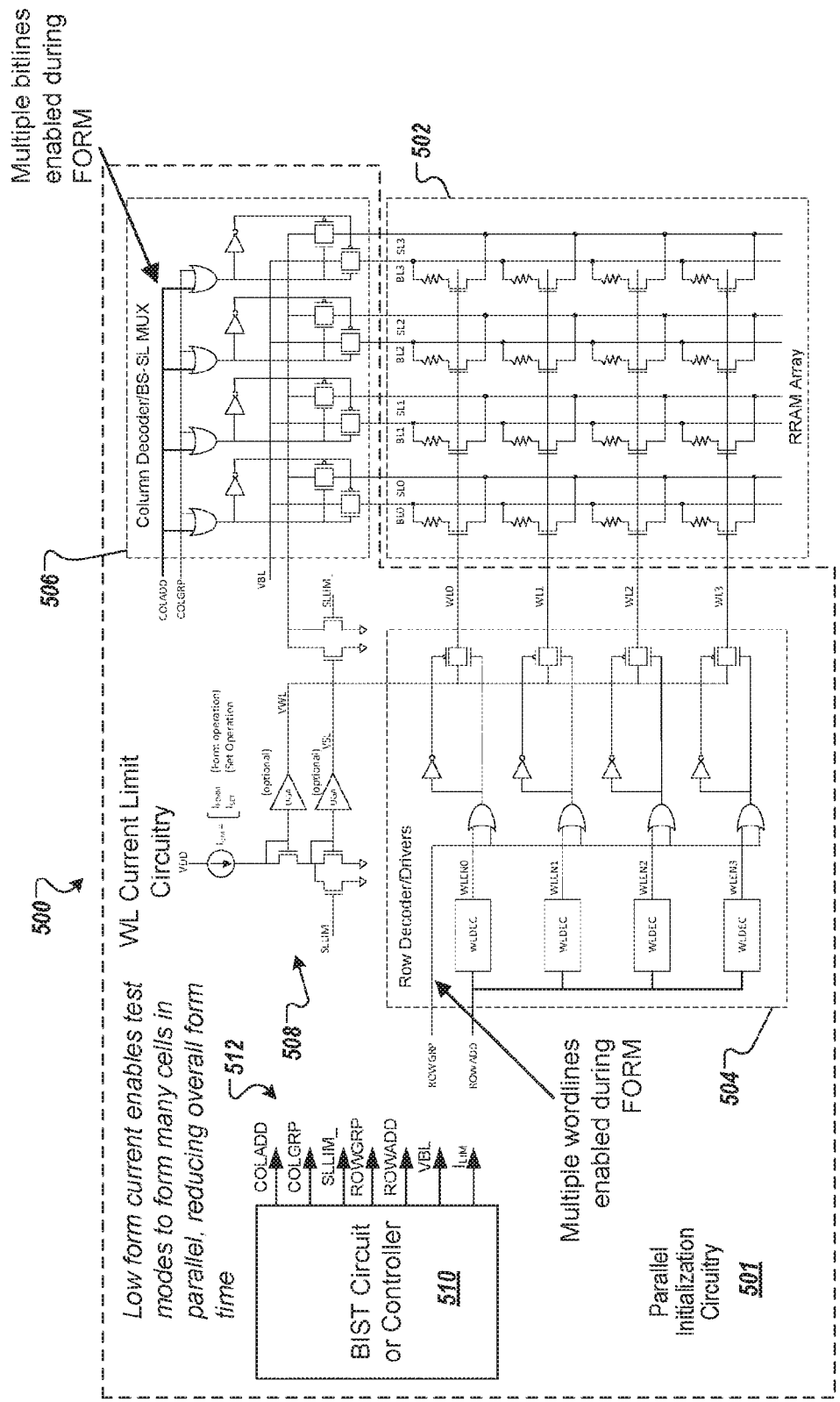
FIG. 5 is a circuit diagram showing a parallel forming test mode of a non-volatile memory device according to one embodiment.

FIG. 5 is a circuit diagram showing a parallel forming test mode of a non-volatile memory device 500 according to one embodiment. The non-volatile memory device 500 includes a RRAM memory array 502 with multiple RRAM cells. Each RRAM cell is a 1T/1R. The non-volatile memory device 500 may include some or all of parallel initialization circuitry 501. The non-volatile memory device 500 also includes row decoder/drivers 504 and column decoder/BL-SL MUX 506. The row decoder/drivers 504 receives control signals, including a row address (ROWADD), and decodes and activates one of the rows of cells based on the decoded row address. The row decoder/drivers 504 may also be referred to as a wordline decoder. The column decoder/BL-SL MUX 506 receives control signals, including a column address (COLADD), and decodes and activates one of the column of cells based on the decoded column address. The column decoder/BL-SL MUX 506 also receives a bit line signal (VBL) to control a multiplexer coupled to bitlines and source-lines of the RRAM cells. The column decoder/BL-SL MUX 506 can be separated into multiple circuits, including a column decoder and a bitline (BL) and source-line (SL) multiplexer.

As illustrated in FIG. 5, the non-volatile memory device 500 also includes wordline current limiting circuitry 508 to limit current during the FORM operation, as well as subsequent SET operations during use of the RRAM memory array 502. The RRAM designs can use current limiting circuits during the FORM and SET operations to control filament formation and create better resistance distributions, as described herein. It should be noted that the WL current limiting circuitry 508 can limit currents for both the wordlines and source lines. The depicted embodiment illustrates one current limiting technique. In other embodiments, other current limiting techniques and corresponding circuitry may be used.

In one embodiment, these current limiting techniques are combined with additional circuitry of the parallel initialization circuitry 501 to enable multiple wordlines and/or multiple bitlines to be formed simultaneously, with each RRAM cell being limited to the same value. In the depicted embodiment of FIG. 5, additional circuitry can be added to the row decoder/drivers 504 and column decoder/BL-SL MUX 506. For example, logic gates are added to the row decoder/drivers 504 and logic gates are added to the column decoder/BL-SL MUX 506 to allow multiple wordlines to be activated in parallel in response to a first control signal (ROWGRP signal) and/or multiple bitlines to be activated in parallel in response to a second control signal (COLGRP signal). The maximum number of cells formed in parallel may be limited only by an amount of current each cell can sink when it forms. The proposed embodiments of the FORM algorithm use very low current limits for the initial form operation (partial-FORM operation), permitting a large number of rows, columns, or both to be activated in parallel. In some cases, the entire chip may be activated for the initial form operation because of the low current. In one embodiment, the current limit is programmable (e.g., IFORM, IsET) using one or more configuration registers, one or more fuses, or the like. The number of wordlines, bitlines, or both, that are activated in parallel is also programmable. In other embodiments, the current limiting circuitry can limit the currents of the wordlines only. In other embodiments, the current limiting circuitry can limit the currents of the source-lines only. The low current for the FORM operation enables test modes to form many cells in parallel, reducing an overall form time. This reduced overall form time may result in shorter testing times when the FORM operation is part of a manufacturing test.

Also, as illustrated in FIG. 5, the non-volatile memory device 500 can be controlled by a controller 510. The controller 510 can be part of a device or system that executes the FORM algorithm as described herein during the manufacturing test to form the RRAM cells of the RRAM memory array 502. In one embodiment, the controller 510 is external to the non-volatile memory device 500 and externally initiates and/or controls the circuitry for parallel initialization of the RRAM cells of the RRAM memory array 502, as part of the FORM algorithms, as described herein, including with respect to the methods 600, 700, and 800 described below. In one embodiment, the controller 510 is part of a BIST circuit that is integrated on the same integrated circuit die of the non-volatile memory device 500. The parallel initialization circuitry 511 can be said to include the controller 510 and additional circuitry to control operations of the initialization of the RRAM cells of the RRAM memory array 502 as part of the FORM algorithm. The parallel initialization circuitry can be initiated either externally by the controller 510 or internally by the controller 510, such as when implemented as an internal BIST circuit. The BIST circuit may include the logic that executes the FORM algorithm. The BIST circuit may include logic to control the additional circuitry of the parallel initialization circuitry 501 to permit parallel initialization of multiple RRAM cells of the RRAM memory array 502 as described herein.

In one embodiment, the controller 510 executes a FORM algorithm to: apply, in a current-limited FORM operation, a first voltage across the resistance change material of a non-volatile memory cell to form an initial filament with a first current; and perform multiple filament-strengthening cycles to strengthen filament characteristics of the initial filament to obtain a filament in the non-volatile memory cell with stronger filament characteristics than the initial filament. Each of the filament-strengthening cycles may include a first operation to apply a second voltage with a first polarity across the resistance change material and a second operation to apply a third voltage with a second polarity across the resistance change material. A first current that flows through the resistance change material, when the first voltage is applied to the resistance change material, is less than a second current that flows through the resistance change material when the second voltage is applied to the resistance change material. In some embodiments, the first current is less than 50 µA. As described herein, the first operation may be a pre-use SET operation and the second operation may be a pre-use RESET operation. The current-limited FORM operation, the pre-use SET operation and the pre-use RESET operation of the FORM algorithm may be performed before a first use of the non-volatile memory cell to store information.

In another embodiment, the controller 510, as part of the FORM algorithm, activates multiple bitlines in parallel while applying the first voltage across the resistance change material. In another embodiment, the controller 510, as part of the FORM algorithm, activates multiple wordlines in parallel while applying the first voltage across the resistance change material. Similarly, the controller 510 can activate multiple bitlines in parallel and multiple wordlines in parallel while applying the first voltage, as well as while performing the first and second operations of the repetitive cycles. In another embodiment, the additional wordlines connect to cells on the same bitline. The controller 510, as part of the FORM algorithm, may verify at least one of the first operation or the second operation, and perform at least one additional filament-strengthening cycle when the at least one of the first operation or second operation fails.

Figure 6:
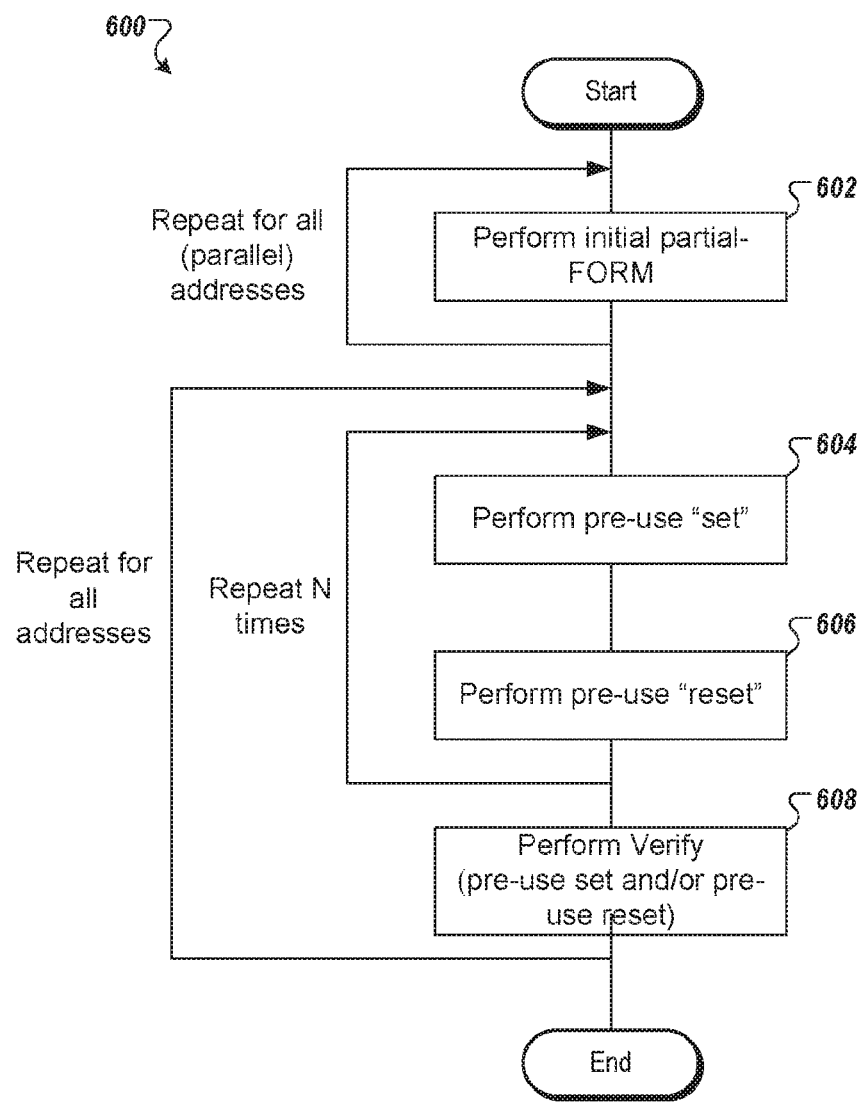
FIG. 6 is a method of initializing a non-volatile memory device using a current-limited FORM operation and multiple filament-strengthening cycles according to another embodiment.

FIG. 6 is a method 600 of initializing a non-volatile memory device using a current-limited FORM operation and multiple filament-strengthening cycles according to another embodiment. The method 600 performs a FORM algorithm, starting with performing the current-limited FORM operation (block 602). The current-limited FORM operation at block 602 can be considered an initial partial-FORM in that the filament is quickly created with limited current and the current is turned off as soon as the filament is created, such as the initial filament 109 illustrated in FIG. 1. It can also be said that the initial filament created at block 602 has a first set of filament characteristics. Block 602 is repeated for all addresses of the memory array. Alternatively, this can be performed for all parallel addresses. Once all addresses or parallel addresses have been completed, the FORM algorithm of method 600 performs multiple filament-strengthening cycles, including a pre-use SET operation (block 604), followed by a pre-use RESET operation (block 606). Blocks 604 and 606 can be repeated N times, where N is a positive integer. In some cases, N can be a predetermined number. In other cases, N is programmable. After repeating blocks 604 and 606 N times, the FORM algorithm of method 600 performs a verify operation (block 608) to verify the SET or RESET from the multiple cycles of the pre-use SET and pre-use RESET operations of blocks 604 and 606. If the verify operation fails at block 608, the FORM algorithm of method 600 returns to perform one or more additional cycles of blocks 604 and 606 until the verify operation does not fail. Assuming a successful verify operation at block 608, the FORM algorithm of method 600 repeats this process for all addresses, returning to block 604 to perform pre-use SET and pre-use RESET operations at blocks 604, 606, for the next address. Once all addresses are completed, the method 600 ends. In one embodiment, performance of the method 600 results in the cell 108 with the initial filament 109 illustrated in FIG. 1. Once the initial filament 109 is formed using the method 600, subsequent RESET and SET operations can be performed during use, resulting in the cell 110 after the RESET operation and resulting in the cell 112 after the SET operation, respectively, as illustrated in FIG. 1.

It should be noted that the pre-use SET operation at block 604 and the pre-use RESET operation at block 606 can use similar or smaller currents than used in a conventional SET operation and a conventional RESET operation. The pre-use SET operation at block 604 pre-use RESET operation at block 606 may not be required to actually set or reset the filament as done with conventional SET and RESET operations. More importantly, the pre-use SET and pre-use RESET operations applying electric fields with opposite polarities to strengthen the initial filament created at block 602. The repetitive cycles of the pre-use SET and pre-use RESET operations strengthen the filament to have a second set of filament characteristics that are better than the first set of filament characteristics. These second set of filament characteristics are also better than filaments created using the conventional FORM operation as described herein.

Figure 7:
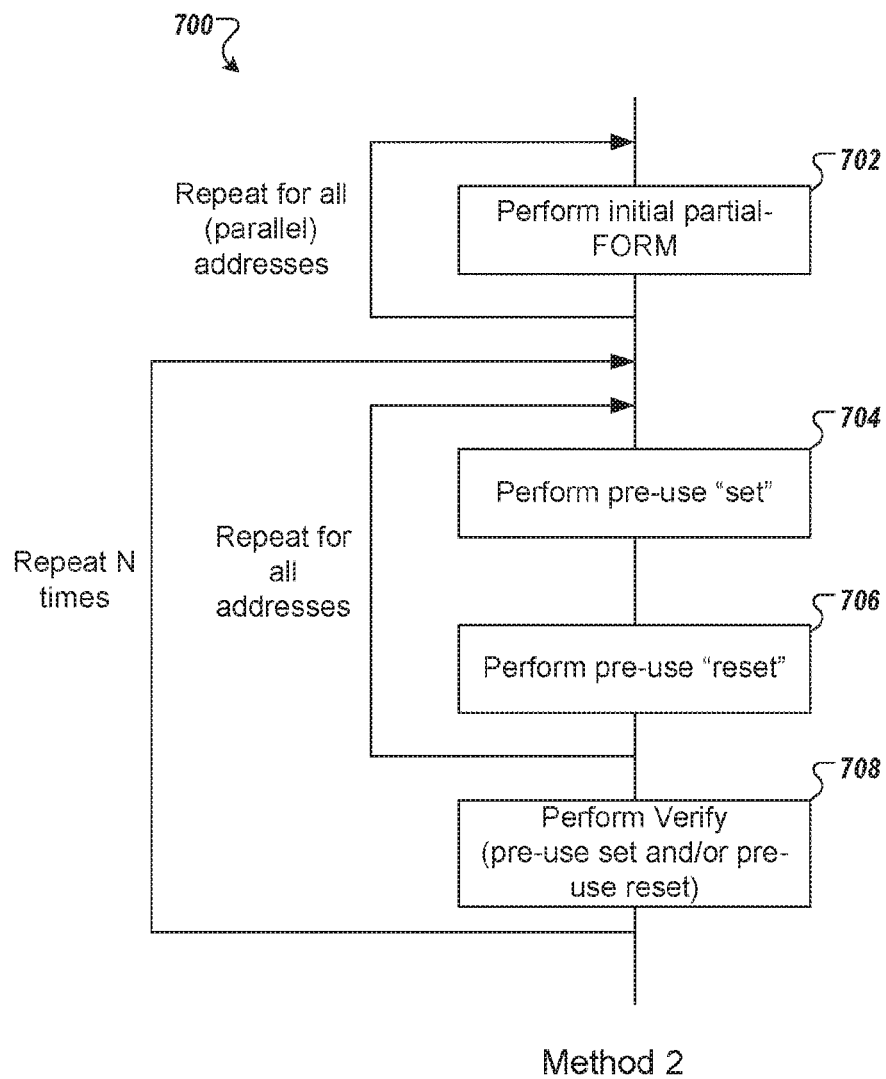
FIG. 7 is a method of initializing a non-volatile memory device using a current-limited FORM operation and multiple filament-strengthening cycles according to another embodiment.

FIG. 7 is a method 700 of initializing a non-volatile memory device using a current-limited FORM operation and multiple filament-strengthening cycles according to another embodiment. The method 700 performs a FORM algorithm, starting with performing the current-limited FORM operation (block 702). The current-limited FORM operation at block 702 can be considered an initial partial-FORM in that the filament is quickly created with limited current and the current is turned off as soon as the filament is created. It can also be said that the initial filament created at block 602 has a first set of filament characteristics. In some embodiments, block 702 is repeated for all addresses of the memory array. Alternatively, this can be performed for all parallel addresses. Once all addresses or parallel addresses have been completed, the FORM algorithm of method 700 performs multiple filament-strengthening cycles, including a pre-use SET operation (block 704), followed by a pre-use RESET operation (block 706). Blocks 704 and 706 can be repeated for all addresses. After repeating blocks 604 and 606 for all addresses, the FORM algorithm of method 700 performs a verify operation (block 708) to verify the SET or RESET from the pre-use SET and pre-use RESET operations of blocks 704 and 706. If the verify operation fails at block 708, the method returns to perform the operations of blocks 704 and 706 until the verify operation does not fail. Assuming a successful verify operation at block 708, the method 700 repeats this process N times, where N is a positive integer. In some cases, N can be a predetermined number. In other cases, N is programmable. In particular, the method 700 returns to block 704 for each of the N cycles. Once the process has been repeated N times, the method 700 ends. In one embodiment, performance of the method 700 results in the cell 108 with the initial filament 109 illustrated in FIG. 1. Once the initial filament 109 is formed using the method 700, subsequent RESET and SET operations can be performed during use, resulting in the cell 110 after the RESET operation and resulting in the cell 112 after the SET operation, respectively, as illustrated in FIG. 1.

Figure 8:
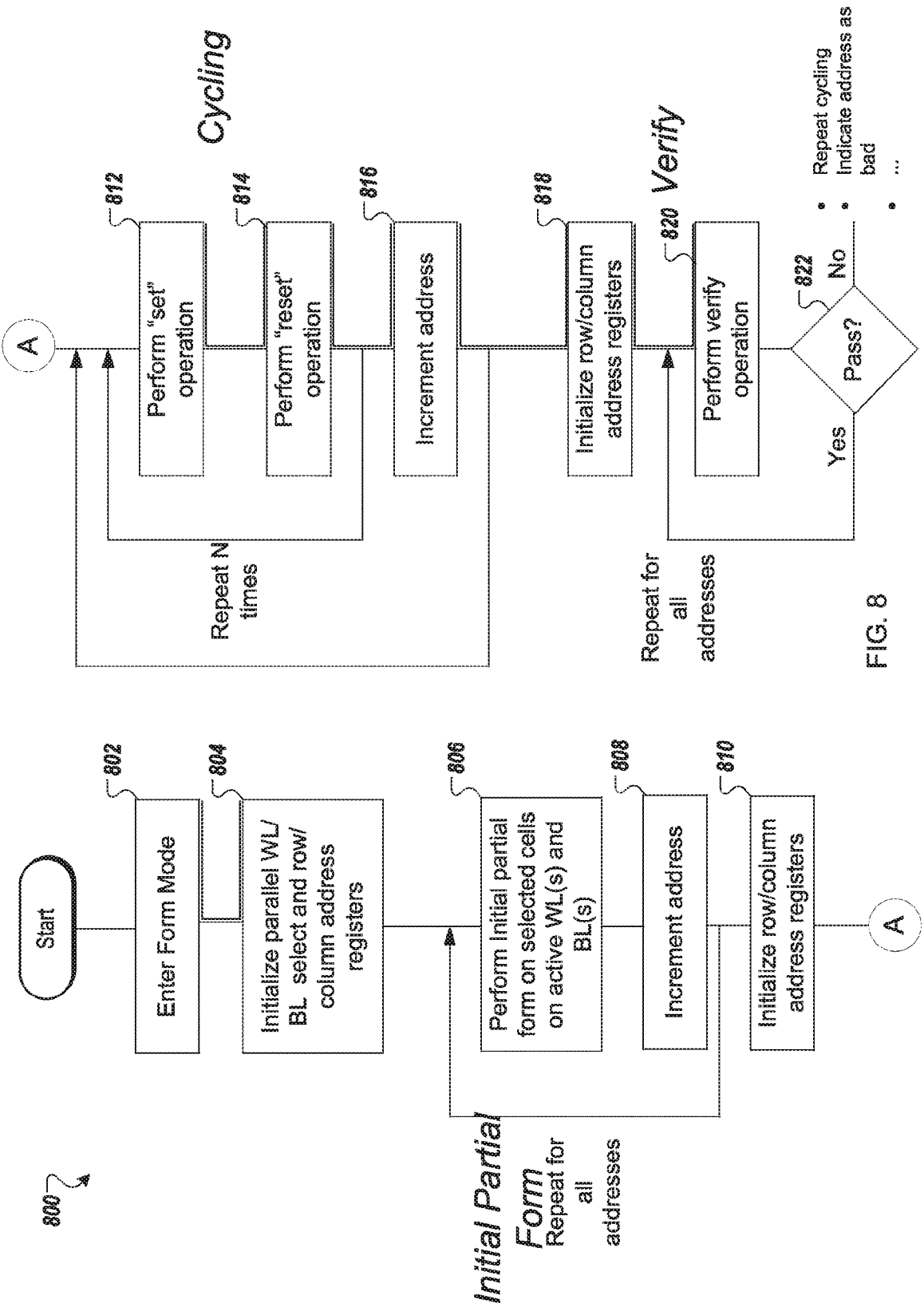
FIG. 8 is a method of initializing a non-volatile memory device using a current-limited FORM operation and multiple filament-strengthening cycles according to another embodiment.

FIG. 8 is a method 800 of initializing a non-volatile memory device using a current-limited FORM operation and multiple filament-strengthening cycles according to another embodiment. The method 800 performs a FORM algorithm, starting with entering a FORM mode (block 802). The FORM algorithm initializes selection of a set of parallel wordlines or a set of parallel bitlines and initializes row and column address registers (block 804). The FORM algorithm of method 800 performs the current-limited FORM operation (block 806). The current-limited FORM operation at block 806 can be considered an initial partial-FORM in that the filament is quickly created with limited current and the current is turned off as soon as the filament is created. It can also be said that the initial filament created at block 806 has a first set of filament characteristics. At block 808, the address is incremented, and block 806 is repeated for all addresses of the memory array. Once all addresses have been completed, the FORM algorithm of method 800 initializes the row and column address registers (block 810). The FORM algorithm of method 800 then performs multiple filament-strengthening cycles. One cycle includes a pre-use SET operation (block 812) and a pre-use RESET operation (block 814). After blocks 812 and 814, the FORM algorithm increments the address at block 816 and returns to block 812 for the next cycle. Blocks 812, 814, and 816, can be repeated N times, where N is a positive integer (programmable or predetermined). The FORM algorithm of method 800 initializes the row and column address registers (block 818). The FORM algorithm of method 800 then performs a verify operation (block 820) to verify the SET or RESET from the pre-use SET and pre-use RESET operations of blocks 812 and 814. The FORM algorithm, at block 822, determines whether the verify operation passes. If the verify operation does not pass, the FORM algorithm can repeat cycling, indicate address as bad, perform a repair operation (e.g., remap address of the failing bits to redundant memory cells), or any combination thereof. If the verify operation for the respective address is verified, the FORM algorithm returns to block 818 to repeat the process for all addresses of the memory array. For example, the address can be incremented when the verify operation passes at block 822 before returning to block 820. Once the process is completed for all addresses, the method 800 ends. In another embodiment, after blocks 812 and 814, a verify operation may be performed. In one embodiment, performance of the method 800 results in the cell 108 with the initial filament 109 illustrated in FIG. 1. Once the initial filament 109 is formed using the method 800, subsequent RESET and SET operations can be performed during use, resulting in the cell 110 after the RESET operation and resulting in the cell 112 after the SET operation, respectively, as illustrated in FIG. 1.

In the above description, numerous details are set forth. It will be apparent, however, to one of ordinary skill in the art having the benefit of this disclosure, that the present embodiments may be practiced without these specific details. In some instances, well-known structures and devices are shown in block diagram form, rather than in detail, in order to avoid obscuring the description.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

The description above includes specific terminology and drawing symbols to provide a thorough understanding of the present embodiments. In some instances, the terminology and symbols may imply specific details that are not required to practice the present embodiments. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g. '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the embodiments have been described with reference to specific details thereof, it will be evident that various modifications and changes may be made thereto without departing from the broader spirit and scope of the embodiments. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the embodiments should, therefore, be determined with reference to the appended claims, along with the full scope of equivalents to which such claims are entitled.

While the embodiments have been described with reference to specific details thereof, it will be evident that various modifications and changes may be made thereto without departing from the broader spirit and scope of the embodiments. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method for initializing a resistive memory device, the method comprising:

applying a first voltage across a metal oxide material of a Resistive Random Access Memory (RRAM) cell to form an initial filament, wherein the first voltage is applied across the metal oxide material in a current-limited FORM operation; and performing a plurality of cycles to condition the initial filament, wherein each of the plurality of cycles comprises:

performing a sequence of multiple first operations to apply a second voltage with a first polarity across the metal oxide material, wherein the first operations are pre-use SET operations;

performing a sequence of multiple second operations to apply a third voltage with a second polarity across the metal oxide material, wherein the second operations are pre-use RESET operations; and verifying at least one of the first operations or the second operations; and performing at least one additional cycle to condition the initial filament when the at least one of the first operations or second operations fail, wherein the current-limited FORM operation, the pre-use SET operations and the pre-use RESET operations are performed before a first use of the RRAM cell.

2. The method of claim 1, wherein the metal oxide material is at least one of Hafnium oxide or Titanium Oxide.

3. The method of claim 1, wherein the resistive memory device comprises a plurality of bitlines, wherein the RRAM cell is coupled to a bitline of the plurality of bitlines, and wherein the method further comprises activating the bitline and one or more additional bitlines of the plurality of bitlines during the applying the first voltage.

4. The method of claim 1, wherein the resistive memory device comprises a plurality of wordlines, wherein the RRAM cell is coupled to a wordline of the plurality of wordlines, wherein the method further comprises activating the wordline and one or more additional wordlines of the plurality of wordlines during the applying the first voltage.

5. The method of claim 4, wherein the resistive memory device comprises a plurality of bitlines, wherein the RRAM cell is coupled to a bitline of the plurality of bitlines, and wherein the one or more additional wordlines are connected to RRAM cell on a same bitline as the bitline coupled to the RRAM cell.

6. An apparatus comprising:

a parallel initialization circuitry; and a Resistive Random Access Memory (RRAM) cell coupled to the parallel initialization circuitry, the RRAM cell comprising a metal oxide material, wherein the parallel initialization circuitry is to perform:

apply a first voltage across the metal oxide material of the RRAM cell to form an initial filament with a first current, wherein the first voltage is applied across the metal oxide material in a current-limited FORM operation;

perform a plurality of filament-strengthening cycles to strengthen filament characteristics of the initial filament to obtain a filament with stronger filament characteristics than the initial filament, wherein each of the plurality of filament-strengthening cycles comprises:

a sequence of multiple first operations to apply a second voltage with a first polarity across the metal oxide material, wherein the first operations are pre-use SET operations; and a sequence of multiple second operations to apply a third voltage with a second polarity across the metal oxide material, wherein the second operations are pre-use RESET operations, and wherein the first current, when the first voltage is applied to the metal oxide material, is limited to a value less than a current limit through the metal oxide material when the second voltage is applied to the metal oxide material;

verify at least one of the first operations or the second operations; and perform at least one additional cycle to condition the initial filament when the at least one of the first operations or second operations fail, wherein the current-limited FORM operation, the pre-use SET operations and the pre-use RESET operations are performed before a first use of the RRAM cell.

7. The apparatus of claim 6, wherein the metal oxide material is at least one of Hafnium oxide or Titanium Oxide.

8. The apparatus of claim 6, further comprising a plurality of bitlines, wherein the RRAM cell is coupled to a bitline of the plurality of bitlines via the parallel initialization circuitry, wherein the parallel initialization circuitry is to activate the bitline and one or more additional bitlines of the plurality of bitlines while applying the first voltage across the metal oxide material.

9. The apparatus of claim 6, further comprising a plurality of wordlines, wherein the RRAM cell is coupled to a wordline of the plurality of wordlines via the parallel initialization circuitry, wherein the parallel initialization circuitry is to activate the wordline and one or more additional wordlines of the plurality of wordlines while applying the first voltage across the metal oxide material.

10. The apparatus of claim 9, wherein the parallel initialization circuitry is further to verify at least one of the first operations or the second operations and perform at least one additional cycle to condition the initial filament when the at least one of the first operations or second operations fail.

11. The apparatus of claim 6, wherein the parallel initialization circuitry comprises a Built-In-Self-Test (BIST) circuit implemented on a same integrated circuit die as the RRAM cell.

* * * * *

UNITED STATES PATENT AND TRADEMARK OFFICE
CERTIFICATE OF CORRECTION

PATENT NO. : 11,468,947 B2
APPLICATION NO. : 17/128707
DATED : October 11, 2022
INVENTOR(S) : Zhichao Lu, Brent Haukness and Gary Bronner Page 1 of 1

It is certified that error appears in the above-identified patent and that said Letters Patent is hereby corrected as shown below:

On the Title Page

In the (63) Related U.S. Application Data:
"(63) Continuation of application No. 16/334,737, filed as application No. PCT/US2017/047902 on Aug. 22, 2017, now Pat. No. 10,943,655."

Should read:
-- (63) Continuation of application No. 16/334,737, filed on Mar. 19, 2019, now U.S. Pat. No. 10,943,655, which is a 371 of PCT/US2017/047902 filed on Aug. 22, 2017. --

Signed and Sealed this
Thirty-first Day of January, 2023

Katherine Kelly Vidal
*Director of the United States Patent and Trademark Office*